(12) United States Patent
Yang et al.

(10) Patent No.: US 7,635,555 B2
(45) Date of Patent: Dec. 22, 2009

(54) METHOD FOR FABRICATING POLYMER RIDGED WAVEGUIDES BY USING TILTED IMMERSION LITHOGRAPHY

(75) Inventors: Hsiharng Yang, 8F.-3, No. 606, Sec. 4, Bade Rd., Taipei City 105 (TW); Chung Chiung Wu, Tainan (TW)

(73) Assignee: Hsiharng Yang, Taipei (TW)

( * ) Notice: Subject to any disclaimer, the term of this patent is extended or adjusted under 35 U.S.C. 154(b) by 208 days.

(21) Appl. No.: 12/000,348

(22) Filed: Dec. 12, 2007

(65) Prior Publication Data
US 2008/0305438 A1 Dec. 11, 2008

(30) Foreign Application Priority Data
Jun. 11, 2007 (TW) .............................. 96121056 A

(51) Int. Cl.
*G02B 6/10* (2006.01)
(52) U.S. Cl. ...................................... 430/321; 430/394
(58) Field of Classification Search ....................... None
See application file for complete search history.

(56) References Cited
FOREIGN PATENT DOCUMENTS
JP 2004-133300 A * 4/2004

OTHER PUBLICATIONS
Computer-generated translation of JP 2004-133300 (Apr. 2004).*
IBM Technical Disclosure Bulletin, vol. 35, Issue 5, pp. 460-462 (Oct. 1992).*
IBM Technical Disclosure Bulletin, vol. 32, Issue 11, pp. 305-307 (Apr. 1990).*

* cited by examiner

*Primary Examiner*—John A. McPherson
(74) *Attorney, Agent, or Firm*—Rosenberg, Klein & Lee

(57) ABSTRACT

This invention is a method for fabricating polymer ridged waveguides by using tilted immersion lithography. It includes the steps of: 1. preparing step; 2. calculating step; 3. first tilted immersion lithography step; 4. rotating 180-degree step; 5. second tilted immersion lithography step; and 6. finishing step. By these two tilted immersion lithography steps as well as the rotating 180-degree step between them, the UV light refracts and makes the photoresist forming a 45-degree ridged waveguide. This fabricating method is simple and stable. It can reduce the fabricating time and cost. Also, it is suitable for mass production and it has wide-ranged applications.

7 Claims, 8 Drawing Sheets

METHOD FOR FABRICATING POLYMER RIDGED WAVEGUIDES BY USING TILTED IMMERSION LITHOGRAPHY

BACKGROUND OF THE INVENTION

1. Field of the Invention

The present invention relates to a method for fabricating polymer ridged waveguides by using tilted immersion lithography. This fabricating method is simple and stable. It can reduce the fabricating time and cost. In addition, it is suitable for mass production and has wide-ranged applications.

2. Description of the Prior Art

The 45° waveguides structure has been studied for many years. The 45° waveguides can be applied in many fields especially in the fields of photoelectric communication or micro optical system. There are two major fabricating methods for it, namely the diamond blade method, etching method, etc. These methods are described below:

[1] Micro machining. Takashi Satoh et al. utilized the V-shaped diamond blade to fabricate the 45° waveguide by the micro machining. The waveguide structure contains three layers. The top and bottom layers are the epoxy layers. The middle one is the deuterated poly-methylmethacrylate for optical signal transmission.

[2] Reaction ion etching (briefly referred as RIE). Jianhua Gan el al. fabricated the 45° waveguide by the lithographic technology. This kind of 45° waveguide has four layers, namely the oxide layer, epoxy layer, aluminum (Al) layer and photoresist layer. By utilizing the reaction ion etching method, the 45° waveguide can be etched. After removing the aluminum layer, the final structure can be obtained.

[3] Laser etching. Ken-ichiro Tanaka et al. fabricated the 45° waveguide by using the KrF-gas excimer laser. The 45° waveguide contains three layers that are epoxy B, epoxy A and epoxy B. Then, one can use the laser etching technique to remove the unnecessary zone so that the desired 45° waveguide can be made.

[4] Deep lithography with protons (briefly referred as DLP). Jurgen Van Erps et al. utilized the Deep Lithography with Protons (DLP) technology to fabricate the multi-mode polymer waveguide for optical signal transmission. The material used in this waveguide is polymethyl methacrylate (or called PMMA). The light source in manufacturing method is similar to the one used in synchrotron radiation. Then, the exposure for fabrication can be achieved.

However, many disadvantages for the above-mentioned prior arts can be listed below:

[1] This fabricating method is complicated and not stable. The conventional methods require complicated equipment (especially for the deep lithography with protons method requires a huge place). In addition, it fabricating procedures becomes complicated as well. Hence, the size of final product is not stable.

[2] The fabricating time is long and its cost is high. For micro machining, the machining speed is very slow. Once the fabricating time is long, its total cost will be increased. Beside, that the deep lithography with protons method requires a huge place will cause extra cost.

[3] It is not suitable for mass production. It requires lengthy time no matter for the micro machining or for the laser etching. Thus, it is not suitable for mass production.

SUMMARY OF THE INVENTION

The primary object of the present invention is to provide a method for fabricating polymer ridged waveguides by using tilted immersion lithography. This fabricating method is simple and stable.

The second object of the present invention is to provide a method for fabricating polymer ridged waveguides by using tilted immersion lithography. It can reduce the fabricating time and cost.

The next object of the present invention is to provide a method for fabricating polymer ridged waveguides by using tilted immersion lithography. It is suitable for mass production.

Another object of the present invention is to provide a method for fabricating polymer ridged waveguides by using tilted immersion lithography. It has wide-ranged applications.

In order to achieve the above-mentioned objects, a technical solution for them is provided by the present invention that is method for fabricating polymer ridged waveguides by using tilted immersion lithography mainly comprising the steps:

1. preparing step;
2. calculating step;
3. first tilted immersion lithography step;
4. rotating 180-degree step;
5. second tilted immersion lithography step; and
6. finishing step.

DETAILED DESCRIPTION OF THE PREFERRED EMBODIMENT

Figure 1:
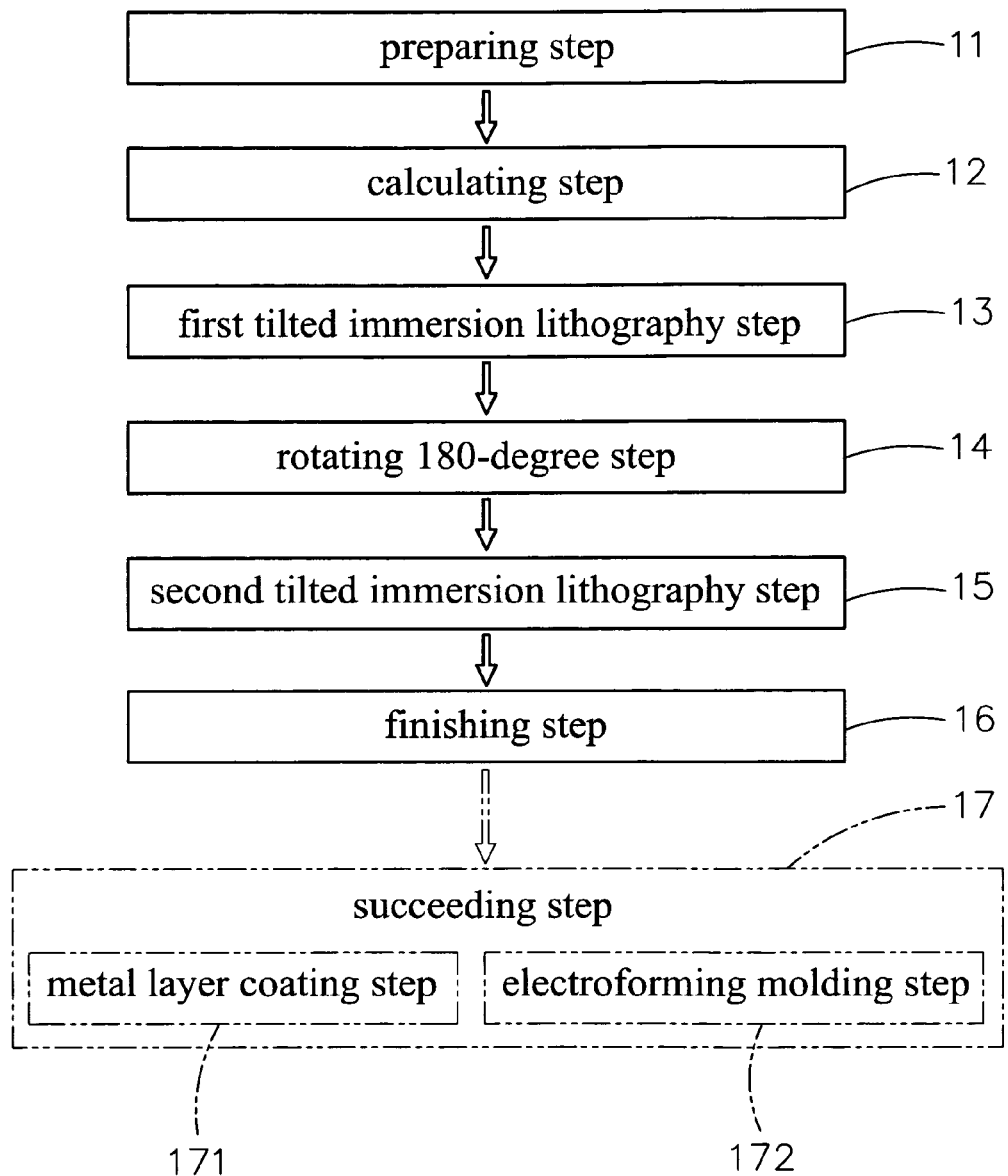
FIG. 1 is a flowchart showing the fabricating method of this invention.
Figure 4:
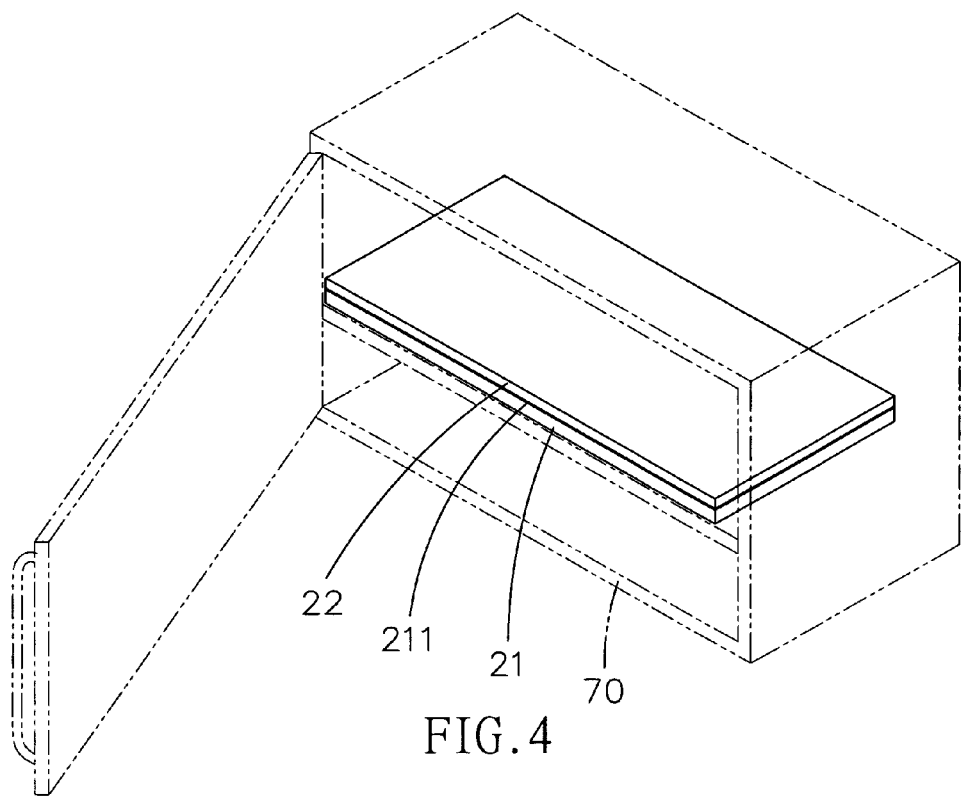
FIG. 4 is a view showing process three of this invention.
Figure 5:
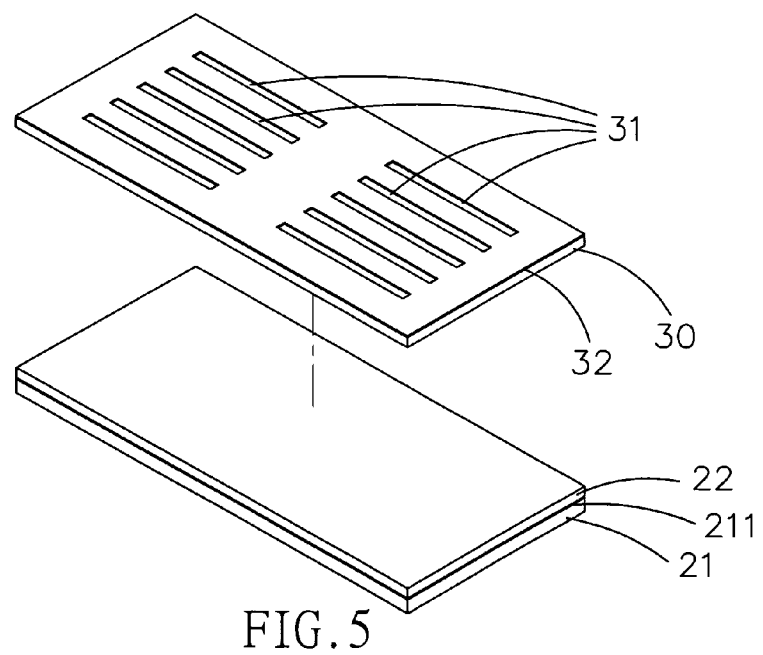
FIG. 5 is a view showing process four of this invention.
Figure 6:
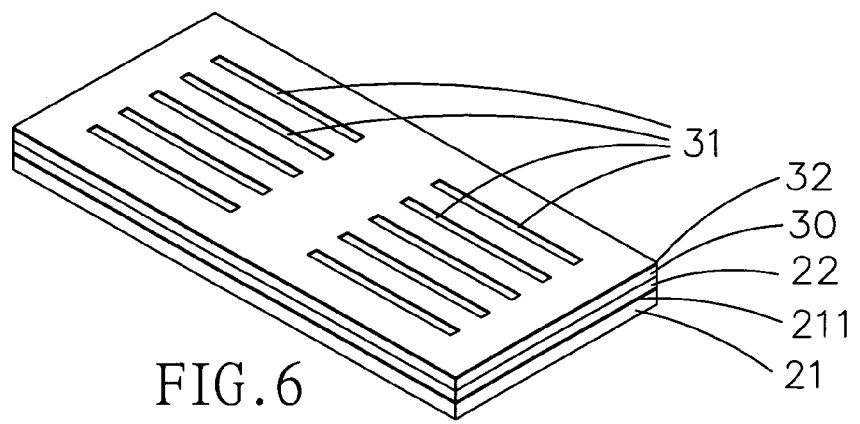
FIG. 6 is a view showing process five of this invention.
Figure 7:
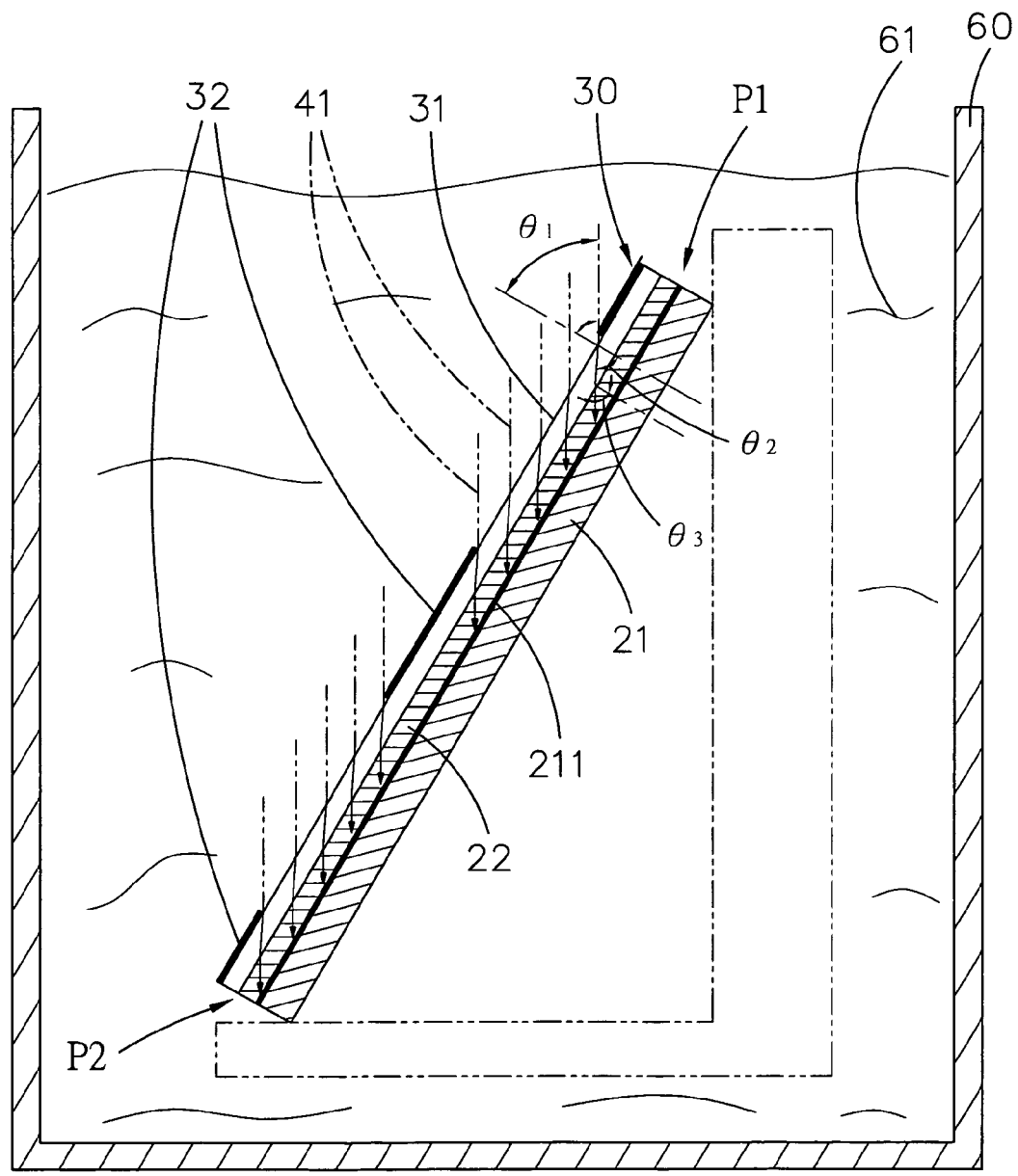
FIG. 7 is a view showing process six of this invention.
Figure 8:
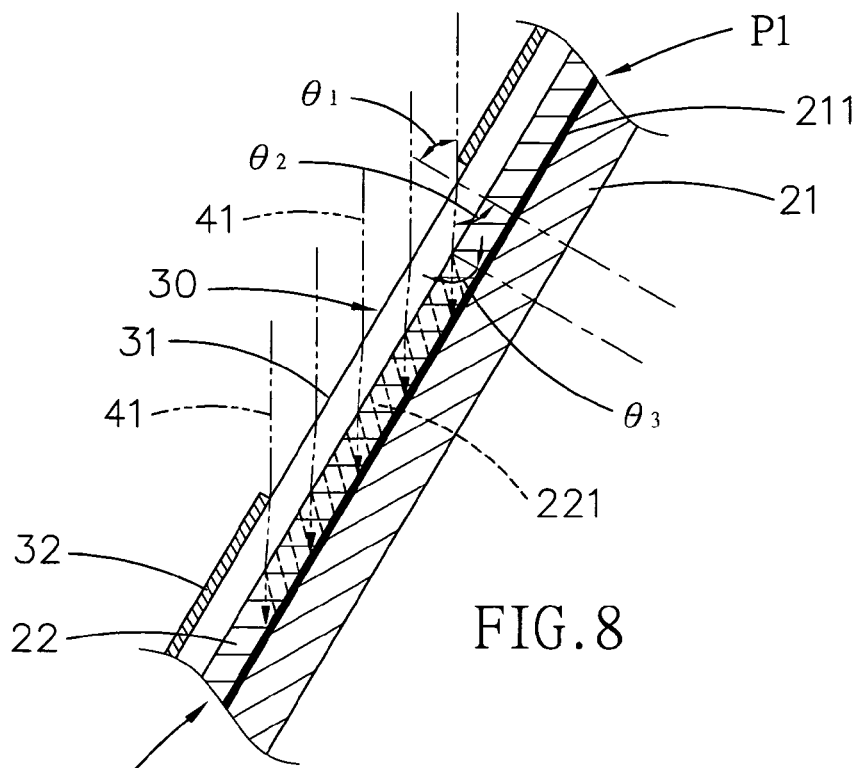
FIG. 8 is a view showing process seven of this invention.
Figure 10A:
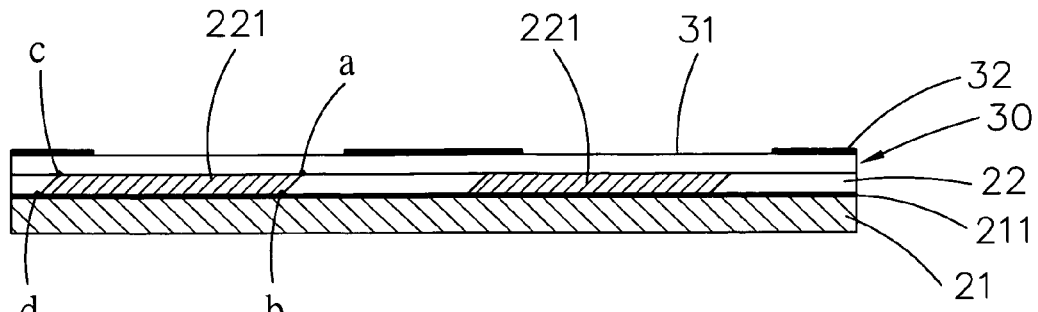
FIGS. 10A, 10B and 10C illustrate the processes of twice tilting exposures of this invention.
Figure 11:
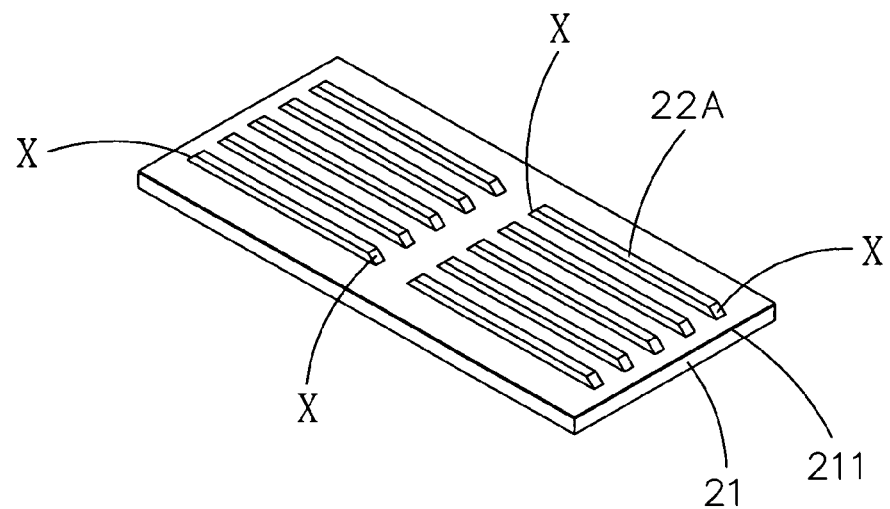
FIG. 11 is a view showing the formed ridged waveguides of this invention.

Referring to FIG. 1, the present invention is a method for fabricating polymer ridged waveguides by using tilted immersion lithography comprising steps of:

[1] preparing step 11: preparing a silicon base plate 21, coating a $SiO_2$ layer 211 on the silicon base plate 11, then coating a photoresist layer 22 on the $SiO_2$ layer 211; heating the silicon base plate 21, $SiO_2$ layer 211 and photoresist 22 (as shown in FIG. 4); covering a mask 30 thereon, the mask 30 having a plurality of light-penetrating portions 31 (as shown in FIGS. 5 and 6); preparing a container 60 with a liquid 61 filled in this container 60 (as illustrated in FIG. 7);

[2] calculating step: by using the Fresnel equations 12:

$$n_1\sin\theta_1 = n_2\sin\theta_2$$
$$n_2\sin\theta_2 = n_3\sin\theta_3$$

so that $$n_1\sin\theta_1 = n_3\sin\theta_3$$
$$\sin\theta_3 = \left(\frac{n_1}{n_3}\right)\sin\theta_1$$
$$\theta_3 = \sin^{-1}\left\{\left(\frac{n_1}{n_3}\right)\sin\theta_1\right\}$$

wherein $\theta_1$ is defined as a first tilting angle (as shown in FIG. 7) between an entering UV light 41 and a referential vertical line normal to the silicon base plate 21, $SiO_2$ layer 211, photoresist 22, and mask 30;

$\theta_2$ is defined as a second tilting angle (as illustrated in FIG. 7) between a refracted light and the referential vertical line;

$\theta_3$ is defined as a third tilting angle which is the tilting angle of the tilting surface of ridged waveguides 22A (as shown in FIG. 11);

$n_1$ is a refracted index of the liquid 61;
$n_2$ is a refracted index of the mask 30
$n_3$ is a refracted index of the photoresist 22;

[3] first tilted immersion lithography step 13: referring to FIG. 7, placing the heated silicon base plate 21, $SiO_2$ layer 211, photoresist 22, and mask 30 in the liquid 61 at a position having the first tilting angle $\theta_1$ (assuming a first end P1 is upward and a second end is downward); starting the entering UV light 41 into the liquid 61 at the first tilting angle $\theta_1$; the entering UV light 41 passing through the light-penetrating portions 31 and the refracting at the second tilting angle $\theta_2$ inside the mask 30 and the refracting at the third tilting angle $\theta_3$ inside the photoresist 22 so as to conduct a first tilting exposure (as shown in FIG. 8 using just one light-penetrating portion 31 as an example) and then to form at least a first forming portion 221 (as shown in FIG. 10A). Moreover, this first forming portion 221 is substantially a parallelogram (zone abcd). Because the photoresist in this example is a negative photoresist (not positive photoresist) such as the JSR-120N negative photoresist, the portion where the UV light 41 passing through will be hardened as solid structure (will be the remaining structure finally) due to certain chemical reaction cause by the UV light 41. The other portion will not be hardened so it can be removed (or washed away) finally. However, for the positive photoresist, the hardening principle is just positive to the above description.

Figure 9:
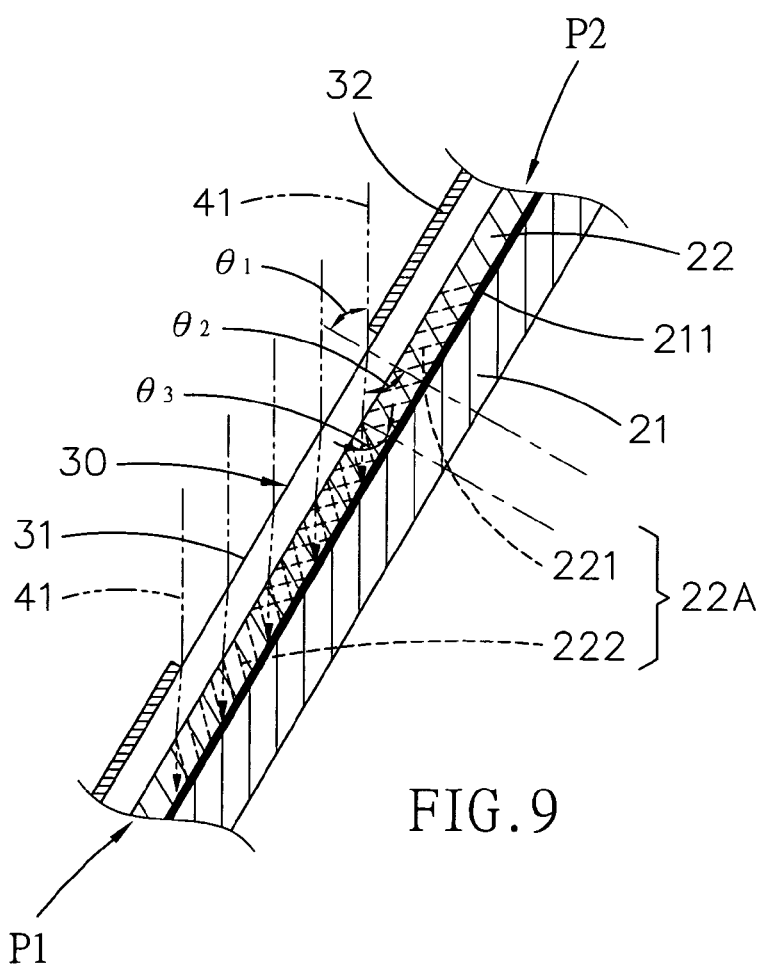
FIG. 9 is a view showing process eight of this invention.
Figure 10B:
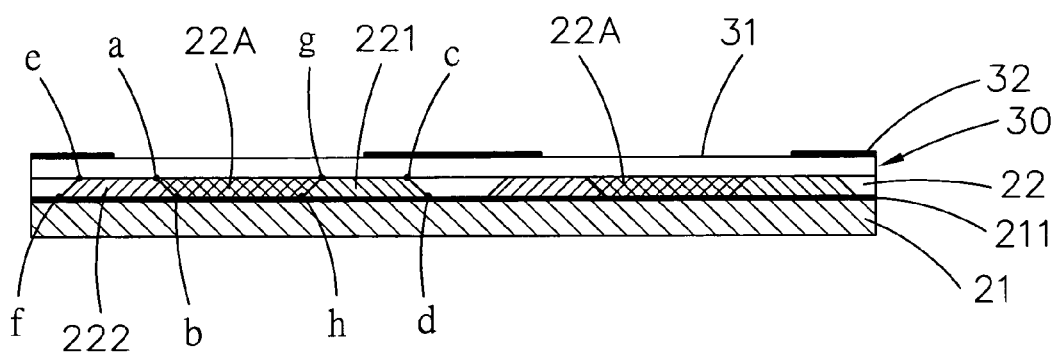

[4] rotating 180-degree step 14: rotating the silicon base plate 21, $SiO_2$ layer 211, photoresist 22, and mask 30 180 degrees (referring to FIG. 9 where the second end P2 becomes upward and the first end P1 becomes downward);

[5] second tilted immersion lithography step 15: placing the rotated silicon base plate 21, $SiO_2$ layer 211, photoresist 22, and mask 30 in the liquid 61 at the same position having the first tilting angle $\theta_1$; starting the entering UV light 41 again into the liquid 61 at the first tilting angle $\theta_1$; the entering UV light 41 passing through the light-penetrating portions 31 and the refracting at the second tilting angle $\theta_2$ inside the mask 30 and then refracting at said third tilting angle $\theta_3$ inside the photoresist 22 so as to conduct a second tilting exposure (as shown in FIG. 9 using just one light-penetrating portion 31 as an example) and then to form at least a second forming portion 222 (zone efgh as shown in FIG. 10B). Similar, after the second tilting exposure, the first forming portion 221 (zone abcd) and the second portion (zone efgh) being partially overlapping (the overlapping area abgh means exposure two times) so as to form a substantially trapezoid zone (zone efcd). No matter once or twice exposure, both of them will be hardened as a transparent solid structure. The remaining portion (non-exposure portion) will be removed later.

Figure 10C:
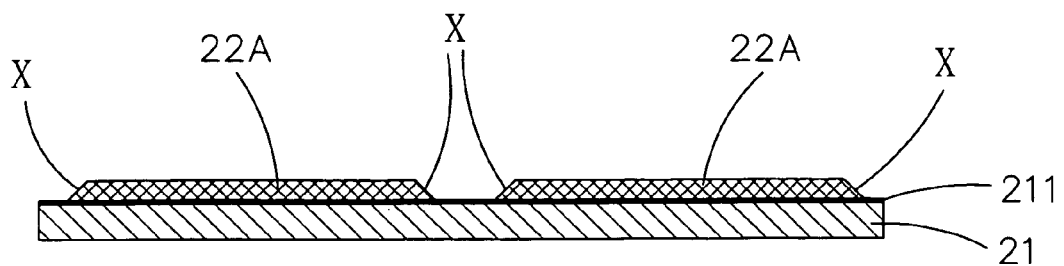

[6] finishing step 16: removing non-exposure potion of the photoresist 22; forming a polymer ridged waveguides 22A (as illustrated in FIGS. 10C and FIG. 11) that is the substantially trapezoid zone consisting of the partially overlapped first forming portion 221 and second portion 222; the polymer ridged waveguides 22A having two end surface X with the third tilting angle $\theta_3$.

Furthermore, as shown in FIGS. 7, 8 and 9, when the UV light 41 that is perpendicular to the liquid surface enters into the liquid 61, there is no refraction occurred. After which, this UV light 41 arrives the light-penetrating portion 31 of the mask 30 at the first tilting angle $\theta_1$. Because the refracted index of the liquid 61 and the refracted index of the mask 30 are different, the following relationship can be obtained based on the Fresnel Refraction Equation:

$$n_1\sin\theta_1 = n_2\sin\theta_2 \quad (1)$$

Thus, one can know the second tilting angle $\theta_2$.

When the UV light 41 further refracts into the photoresist 22, the same principle can be utilized.

So, one can obtain the equation (2) below:

$$n_2\sin\theta_2 = n_3\sin\theta_3 \quad (2)$$

If one wants to let the UV light enter into the photoresist at 45 degrees (that is the third tilted angle $\theta_3$). One can combine the equations (1) and (2) and then obtain the following results.

$$n_1\sin\theta_1 = n_3\sin\theta_3 \quad (3)$$
$$\sin\theta_3 = \left(\frac{n_1}{n_3}\right)\sin\theta_1$$
$$\theta_3 = \sin^{-1}\left\{\left(\frac{n_1}{n_3}\right)\sin\theta_1\right\}$$

Assuming $\theta_1=63°$ (for obtaining an $\theta_3=45°$), $n_1=1.33$, and $n_3=1.67$, using the equation (3), one can obtain:

$$\theta_3 = \sin^{-1}\left\{\left(\frac{1.33}{1.67}\right)\sin 63°\right\}$$
$$\theta_3 = 45.2° \text{ (very close to } 45°\text{)}$$

Therefore, it is possible to fabricate the ridged waveguides 22A having two end surface X at 45 degrees.

Practically, during the preparing step 11, it can further include a washing procedure to wash the silicon base plate 21 by a solution of sulfuric acid and hydrogen peroxide with de-ionized water, while the ratio of the sulfuric acid to the hydrogen peroxide is 3:1; and then heating the silicon base plate 21 approximately at 120° C. in a stove.

The $SiO_2$ layer 211 has a thickness of approximately 200 µm.

Figure 2:
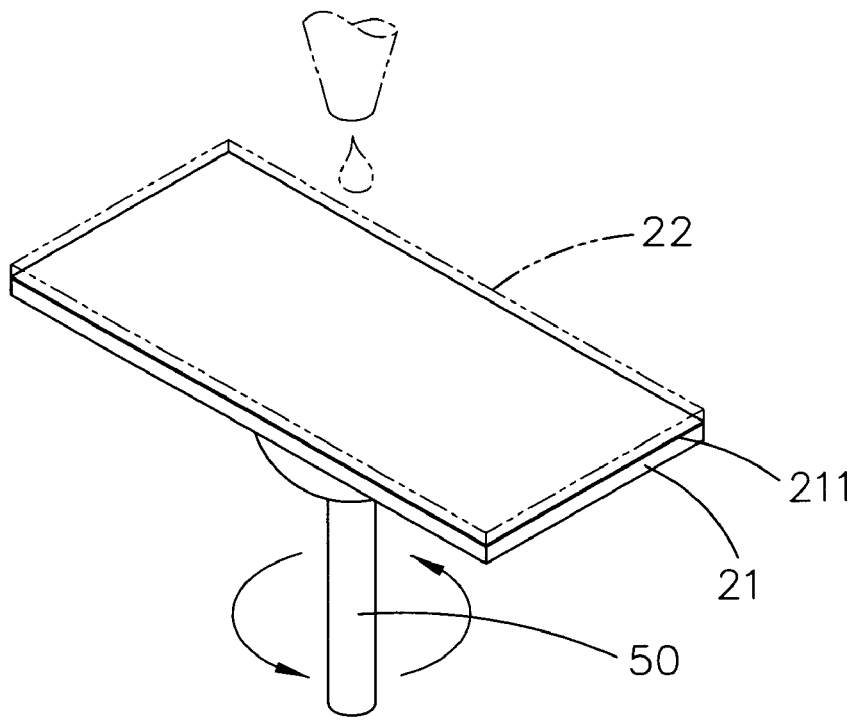
FIG. 2 is a view showing process one of this invention.
Figure 3:
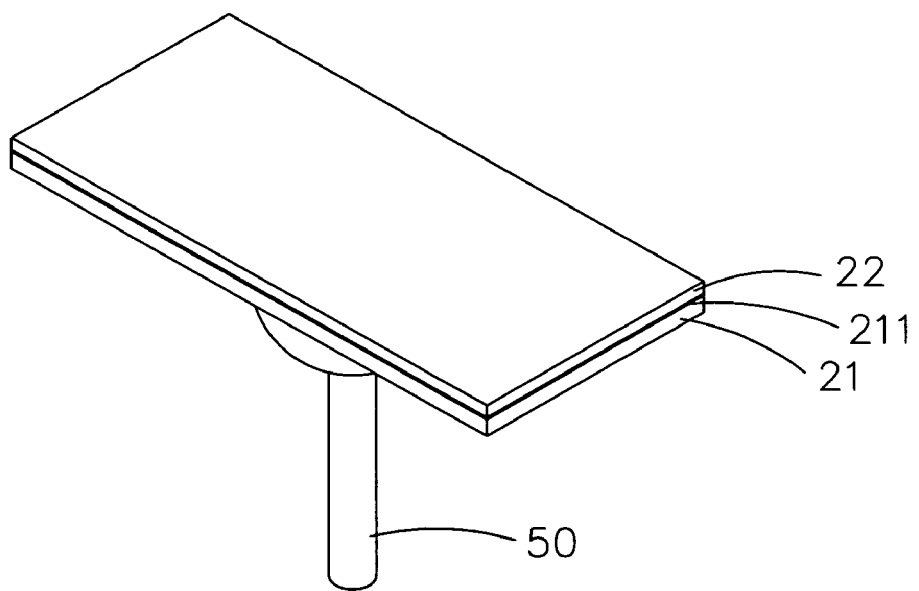
FIG. 3 is a view showing process two of this invention.

The photoresist layer 22 is coated by a rotational depositing device 50 (as shown in FIGS. 2 and 3) having a first stage of 300 rpm and 15 seconds and a second stage of 900 rpm and 30 seconds to obtaining an evenly-distributed coating layer.

The photoresist 22 is a negative photoresist of JSR-120N type. The silicon base plate 21, SiO$_2$ layer 211 and the photoresist 22 are placed inside the stove for approximately 7 minutes at approximately 100° C. (as illustrated in FIG. 4).

This mask 30 is a glass plate with a light-blocking layer 32 around the light-penetrating portions 31. Each light-penetrating portion 31 preferably has a length of 2000 μm and a width of 100 μm.

The container 60 is a square container made by glass. The fluid 61 is de-ionized water or other fluid.

In addition, the UV light 41 is 1280 mJ/cm$^2$ and 80 sec in the first tilted immersion lithography step 13.

Also, the UV light 41 is 1280 mJ/cm$^2$ and 80 sec in the second tilted immersion lithography step 14.

Besides, after said finishing step, this invention can further comprise:

[7] succeeding step 17: it has a step selected from one of following steps.

Figure 12:
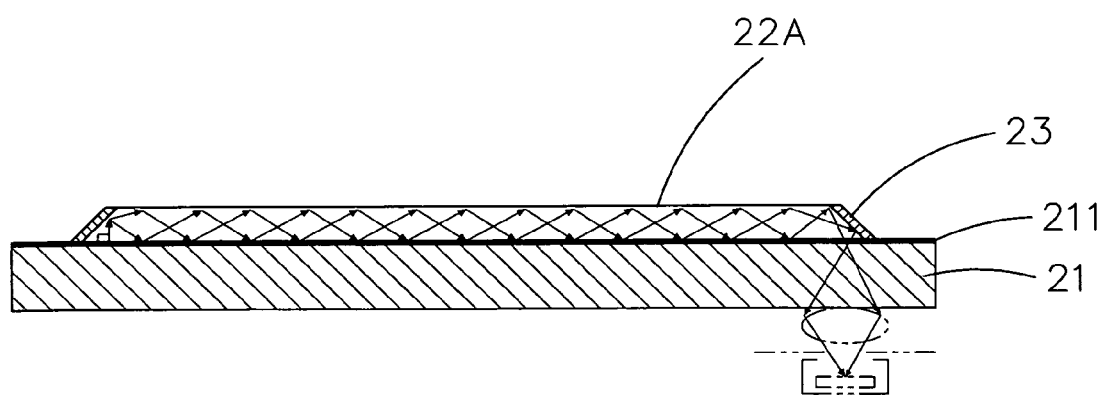
FIG. 12 is a view showing the formed ridged waveguides coated with a meal layer of this invention.

[a] Metal layer coating step 171: as shown in FIG. 12, this step is used for coating a metal layer 23 on the two end surfaces X ridged waveguides 22A so as to filtering a light with a predetermined range of wavelength. It can be applied in the field of CD/DVD optical reader, etc.

Figure 13A:
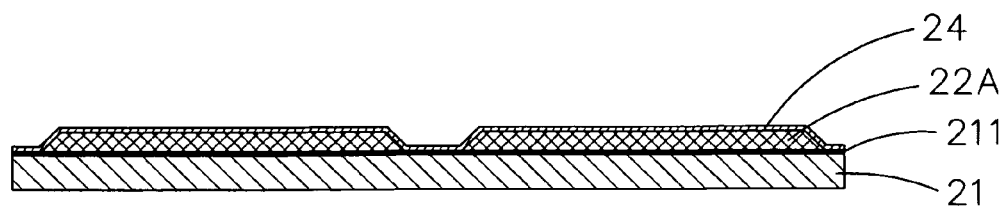
FIGS. 13A, 13B and 13C illustrate the processes about the molding for ridged waveguides of this invention.
Figure 13B:
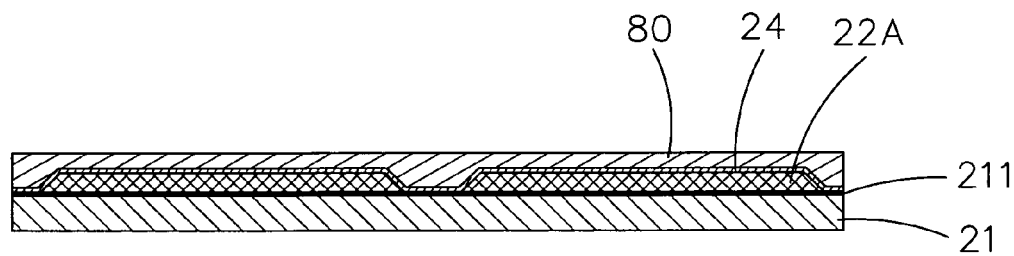
Figure 13C:
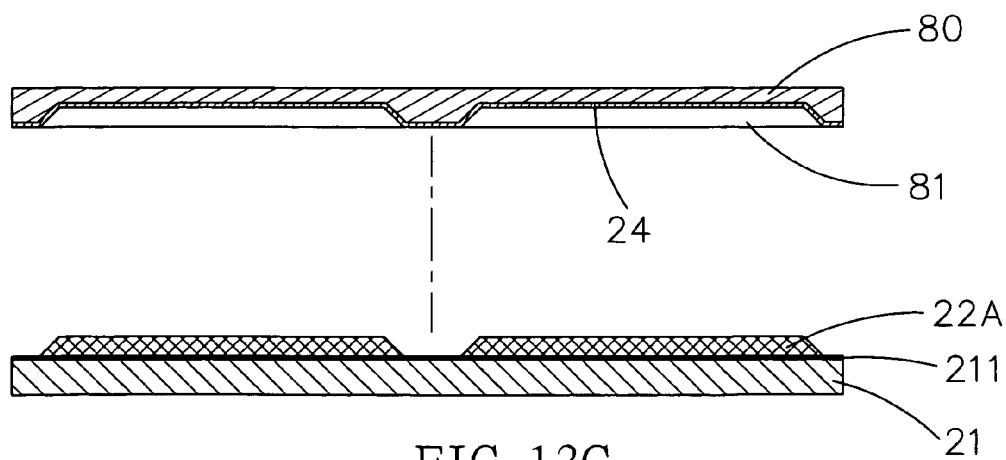

[b] Electroforming molding step 172: as shown in FIG. 13A, this step is used for coating an electrical conducting layer 24 that forms a mold 80 (as shown in FIG. 13B) having a cavity 81 (as shown in FIG. 13C) corresponding to ridged waveguides 22A so as to be used for injection forming. It is suitable for mass production for the ridged waveguides 22A. The electrical conducting layer 24 can be a metal with low electrical resistance.

The advantages and functions of the present invention can be summarized as follows.

[1] This fabricating method is simple and stable. The invention utilizes a class mask with many light-penetrating portions to cover on a photoresist and then immerse into a liquid at a specific angle. By applying the UV light, the light will refract at two interfaces due to the Fresnel Refraction principle. Also, by using the twice exposures technique and simply rotating 180-degree, a 45° ridged waveguide can be produced. The fabricating method is simple and the size of the final product is stable.

[2] It can reduce the fabricating time and cost. This invention utilizes the lithography method to replace the conventional micro machining method (by diamond blade) or the conventional etching related methods. Thus, this invention can reduce the fabricating time and cost.

[3] It is suitable for mass production. If one uses the electroforming method to produce a mold with a cavity for such 45° ridged waveguide, this mold can be used for injection later. Hence, it is suitable for mass production.

[4] It has wide-ranged applications. The exposure technique in this invention can make a precisely forming. Under the circumstances, 45° ridged waveguide can be applied in many fields, such as electro-optical (E-O) modulator, polarization splitter, beam splitter, optical sensor, phase modulator, CD/DVD reader, and so on.

The above embodiments are only used to illustrate the present invention, not intended to limit the scope thereof. Many modifications of the above embodiments can be made without departing from the spirit of the present invention.

What is claimed is:

1. A method for fabricating polymer ridged waveguides by using tilted immersion lithography comprising steps of:
   [1] preparing step: preparing a silicon base plate, coating a SiO$_2$ layer on said silicon base plate, then coating a photoresist layer on said SiO$_2$ layer; heating said silicon base plate, SiO$_2$ layer and photoresist, covering a mask thereon, said mask having a plurality of light-penetrating portions; preparing a container with a liquid filled in said container;
   [2] calculating step: by using the Fresnel equations:

$$n_1 \sin\theta_1 = n_2 \sin\theta_2$$
$$n_2 \sin\theta_2 = n_3 \sin\theta_3$$

so that $$n_1 \sin\theta_1 = n_3 \sin\theta_3$$
$$\sin\theta_3 = \left(\frac{n_1}{n_3}\right)\sin\theta_1$$
$$\theta_3 = \sin^{-1}\left\{\left(\frac{n_1}{n_3}\right)\sin\theta_1\right\}$$

wherein
   $\theta_1$ is defined as a first tilting angle between an entering UV light and a referential vertical line normal to said silicon base plate, SiO$_2$ layer, photoresist, and mask;
   $\theta_2$ is defined as a second tilting angle between a refracted light and said referential vertical line;
   $\theta_3$ is defined as a third tilting angle which is the tilting angle of the tilting surface of ridged waveguides;
   $n_1$ is a refracted index of said liquid;
   $n_2$ is a refracted index of said mask;
   $n_3$ is a refracted index of said photoresist;
   [3] first tilted immersion lithography step: placing said heated silicon base plate, SiO$_2$ layer, photoresist, and mask in said liquid at a position having said first tilting angle; starting said entering UV light into said liquid at said first tilting angle; said entering UV light passing through said light-penetrating portions and then refracting at said second tilting angle inside said mask and the refracting at said third tilting angle inside said photoresist so as to conduct a first tilting exposure and then to form at least a first forming portion;
   [4] rotating 180-degree step: rotating said silicon base plate, SiO$_2$ layer, photoresist, and mask 180 degrees;
   [5] second tilted immersion lithography step: placing said rotated silicon base plate, SiO$_2$ layer, photoresist, and mask in said liquid at the same position having said first tilting angle; starting the entering UV light again into said liquid at said first tilting angle; said entering UV light passing through said light-penetrating portions and the refracting at said second tilting angle inside said mask and then refracting at said third tilting angle inside said photoresist so as to conduct a second tilting exposure and then to form at least a second forming portion; and said first forming portion and said second portion being partially overlapping so as to form a substantially trapezoid zone; and
   [6] finishing step: removing non-exposure potion of said photoresist; forming a polymer ridged waveguides that is the substantially trapezoid zone consisting of said partially overlapped first forming portion and second portion; said polymer ridged waveguides having two end surface with said third tilting angle.

2. The method for fabricating polymer ridged waveguides by using tilted immersion lithography as claimed in claim 1, wherein
   the preparing step further including a washing procedure to wash said silicon base plate by a solution of sulfuric acid and hydrogen peroxide with de-ionized water, said ratio of said sulfuric acid to said hydrogen peroxide being 3:1; and then heating said silicon base plate approximately at 120° C. in a stove;

said $SiO_2$ layer having a thickness of approximately 200 μm;

said photoresist layer being coated by a rotational depositing device having first stage of 300 rpm and 15 seconds and a second stage of 900 rpm and 30 seconds to obtaining a evenly-distributed coating layer;

said photoresist being a negative photoresist, and said silicon base plate, said $SiO_2$ layer and said photoresist being placed inside said stove for approximately 7 minutes at approximately 100° C.;

said mask being a glass plate with a light-blocking layer around said light-penetrating portions, each light-penetrating portion has a length of 2000 μm and a width of 100 μm; and said container being made by glass; said fluid being de-ionized water.

3. The method for fabricating polymer ridged waveguides by using tilted immersion lithography as claimed in claim 1, wherein said UV light being 1280 $mJ/cm^2$ and 80 sec in said first tilted immersion lithography step.

4. The method for fabricating polymer ridged waveguides by using tilted immersion lithography as claimed in claim 1, wherein said UV light being 1280 $mJ/cm^2$ and 80 sec in said second tilted immersion lithography step.

5. The method for fabricating polymer ridged waveguides by using tilted immersion lithography as claimed in claim 1, after said finishing step, further comprising a succeeding step containing a metal layer coating step for coating a metal layer so as to filtering a light with a predetermined range of wavelength.

6. The method for fabricating polymer ridged waveguides by using tilted immersion lithography as claimed in claim 1, after said finishing step, further comprising a succeeding step containing an electroforming molding step for coating an electrical conducting layer that forms a mold having a cavity corresponding to ridged waveguides so as to be used for injection forming.

7. The method for fabricating polymer ridged waveguides by using tilted immersion lithography as claimed in claim 6, wherein said electrical conducting layer being a metal with low electrical resistance.

* * * * *